United States Patent
Kang

(10) Patent No.: US 9,570,715 B2
(45) Date of Patent: Feb. 14, 2017

(54) MASK AND MASK ASSEMBLY

(71) Applicant: Samsung Display Co., LTD., Yongin, Gyeonggi-Do (KR)

(72) Inventor: Taek-Kyo Kang, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 460 days.

(21) Appl. No.: 13/972,714

(22) Filed: Aug. 21, 2013

(65) Prior Publication Data
US 2014/0065355 A1    Mar. 6, 2014

(30) Foreign Application Priority Data
Sep. 3, 2012 (KR) .......... 10-2012-0097070

(51) Int. Cl.
*H01L 51/56* (2006.01)
*C23C 14/04* (2006.01)
*H01L 51/00* (2006.01)

(52) U.S. Cl.
CPC .......... *H01L 51/56* (2013.01); *C23C 14/042* (2013.01); *H01L 51/0011* (2013.01); *Y10T 428/24314* (2015.01); *Y10T 428/24322* (2015.01)

(58) Field of Classification Search
CPC .......... H01L 51/56; Y10T 428/24314
See application file for complete search history.

(56) References Cited

U.S. PATENT DOCUMENTS

| | | | |
|---|---|---|---|
| 2004/0104197 A1* | 6/2004 | Shigemura | C23C 14/042 216/20 |
| 2009/0137180 A1* | 5/2009 | Sung | C23C 14/042 445/60 |

FOREIGN PATENT DOCUMENTS

| KR | 100814818 B1 | 3/2008 |
|---|---|---|
| KR | 1020110104793 A | 9/2011 |

* cited by examiner

*Primary Examiner* — William P Watkins, III
(74) *Attorney, Agent, or Firm* — Robert E. Bushnell, Esq.

(57) ABSTRACT

A mask supported at a frame when a tensile force is applied in a first direction is provided. The mask includes a mask main body in a band shape extended in the first direction, and a plurality of pattern openings formed in the mask main body. the mask main body has ends supported by the frame, and the pattern opening are arranged in the first direction. The mask further includes a dummy opening provided between the pattern openings and one of the ends of the mask main body. The dummy opening has a form that is different from forms of the pattern openings.

8 Claims, 6 Drawing Sheets

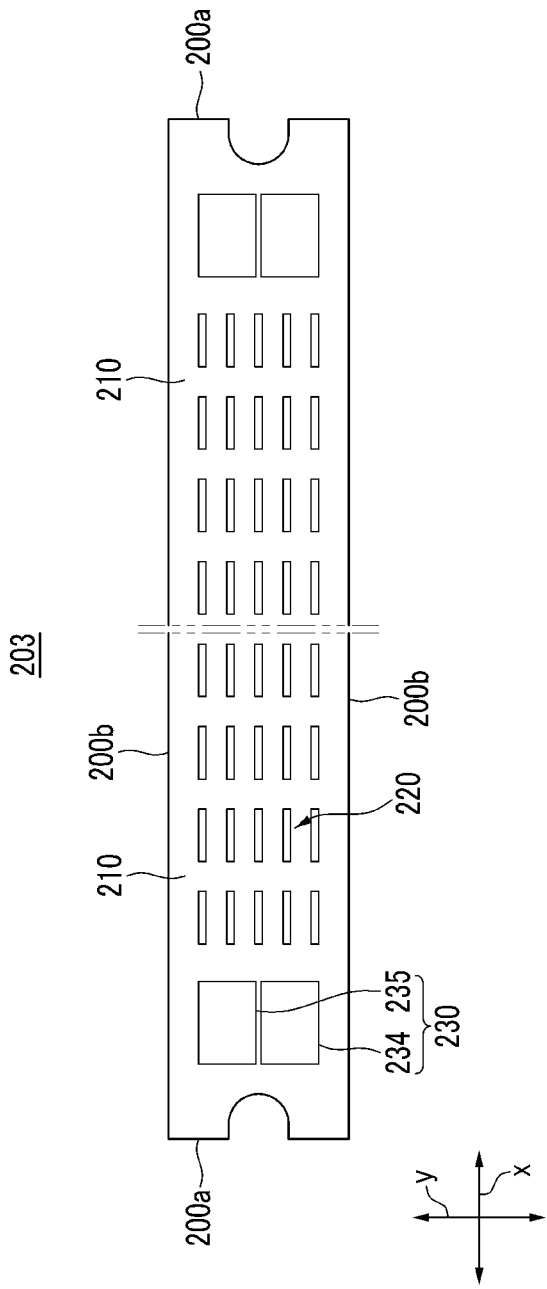

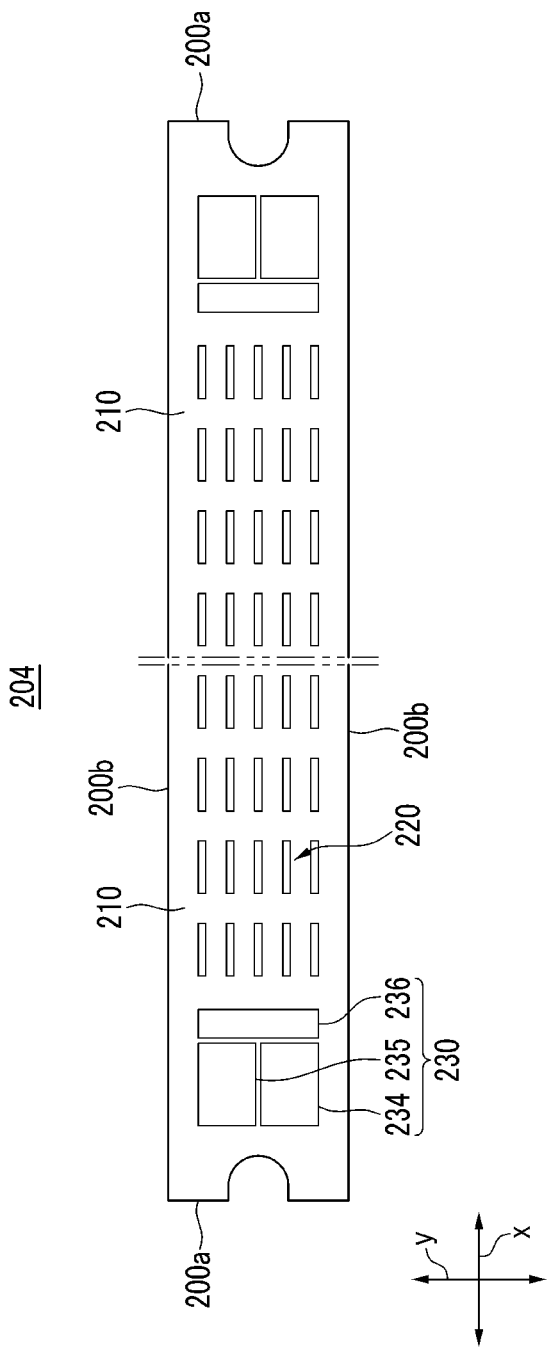

MASK AND MASK ASSEMBLY

RELATED APPLICATIONS

This application claims priority to and the benefit of Korean Patent Application No. 10-2012-0097070 filed in the Korean Intellectual Property Office on Sep. 3, 2012, the entire contents of which are incorporated herein by reference.

BACKGROUND

Field

The described technology relates generally to a mask and a mask assembly. More particularly, the described technology relates generally to a mask used for depositing an organic layer and a mask assembly.

Description of the Related Art

Generally, as a representative example of a flat panel display, there are an organic light emitting display, a liquid crystal display, a plasma display panel, etc.

Among them, in order to manufacture the organic light emitting display, an electrode having specific patterns, an organic emission layer, etc. should be formed. The method for forming the electrode and the organic emission layer, etc. can be applied to a deposition method using a mask assembly.

More specifically, the organic light emitting display includes pixels that are a basic unit displaying images on a substrate and arrayed in a matrix form, and an organic light emitting diode that has an anode, a first electrode and a cathode, and a second electrode sequentially formed, with organic emission layers each emitting light such as red, green, blue, or white, for each pixel therebetween. Organic materials forming the organic emission layer are very vulnerable to moisture and oxygen, etc., such that they should be thoroughly isolated from moisture during a process of forming the organic emission layer and after forming the organic emission layer. Therefore, it is difficult to perform patterning using a general photolithography process. Consequently, the organic emission layer is formed using a mask in which pattern openings for penetrating deposition materials only through a portion corresponding to each pattern is formed.

Recently, a mask assembly including a frame including an opening and a plurality of masks in a band shape of which both ends are fixed to the frame, corresponding to the opening, has been used.

The mask assembly in the related art is fixed to the frame by applying tensile force to the mask, such that the shape of the pattern openings formed in the mask due to the tensile force applied to the mask may be deformed.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a mask that controls deformation of pattern openings formed in a mask due to tensile force applied to the mask, and a mask assembly having the same.

An exemplary embodiment provides a mask supported at a frame when a tensile force is applied in a first direction, and includes a mask main body in a band shape extended in the first direction; a plurality of pattern openings formed in the mask main body. The mask main body has ends supported by the frame, and the pattern openings are arranged in the first direction. The mask further includes a dummy opening provided between the pattern openings and one of the ends of the mask main body. The dummy opening has a form that is different from forms of the pattern openings.

The dummy opening includes a plurality of sub-dummy openings.

The dummy opening includes: a first sub-dummy opening provided between the pattern openings and the one of the ends of the mask main body; and a second sub-dummy opening provided between the first sub-dummy opening and the pattern openings.

The first sub-dummy opening and the second sub-dummy opening have a same shape and neighbor each other.

The first sub-dummy opening and the second sub-dummy opening respectively have a rectangular shape having a longer side in a second direction crossing the first direction.

The dummy opening further includes a third sub-dummy opening provided between the first sub-dummy opening and the second sub-dummy opening.

The first sub-dummy opening, the second sub-dummy opening, and the third sub-dummy opening respectively have a same rectangular shape having a longer side extended in the second direction crossing the first direction.

The dummy opening includes a fourth sub-dummy opening and a fifth sub-dummy opening disposed to neighbor each other between both edges of the mask main body. The fourth and fifth sub-dummy openings are arranged in the second direction crossing the first direction.

The fourth sub-dummy opening and the fifth sub-dummy opening respectively have a same shape and neighbor each other.

The fourth sub-dummy opening and the fifth sub-dummy opening respectively have a rectangular shape having a longer side extended in the first direction.

The dummy opening further includes a sixth sub-dummy opening provided between the pattern openings and a set of the fourth sub-dummy opening and the fifth sub-dummy opening.

The fourth sub-dummy opening and the fifth sub-dummy opening respectively have a same rectangular shape having a longer side extended in the first direction, and the sixth sub-dummy opening has a rectangular shape having a longer side extended in the second direction.

Each pattern opening has a stripe or dot form.

Another exemplary embodiment provides a mask assembly including a frame including an opening, and at least one mask, which has the structural features described above, provided in the opening.

According to the embodiments, a mask that suppresses deformation of pattern openings formed in a mask due to tensile force applied to the mask and a mask assembly having the same are provided.

BRIEF DESCRIPTION OF THE DRAWINGS

FIG. 5 shows a top plan view of a mask according to a third exemplary embodiment.

FIG. 6 shows a top plan view of a mask according to a fourth exemplary embodiment.

DETAILED DESCRIPTION

Figure 1:
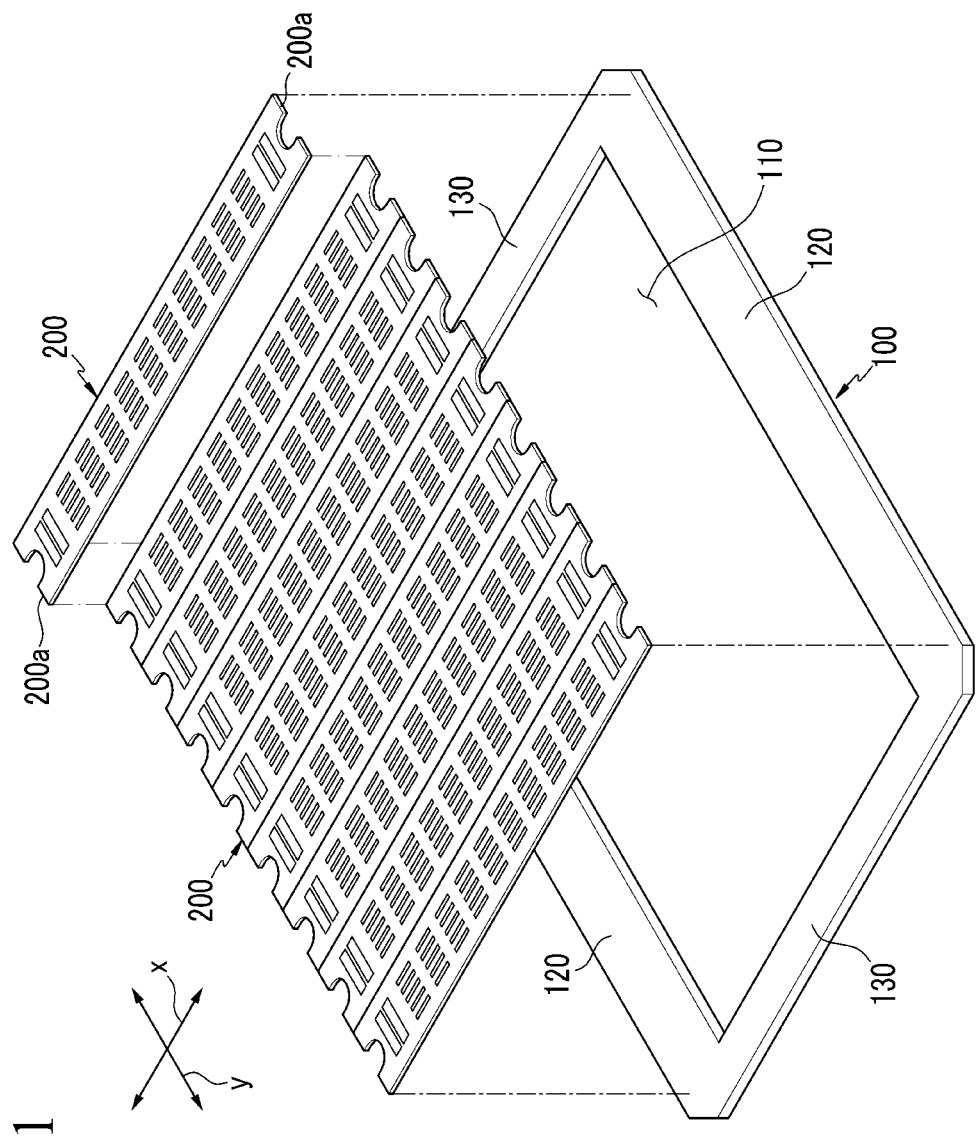
FIG. 1 shows an exploded perspective view of a mask assembly according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, a configuration having the same components denoted by the same reference numerals will representatively be in a first exemplary embodiment of various exemplary embodiments, and other components different from the first exemplary embodiment will be described in other exemplary embodiments.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Further, throughout the specification, "on" implies being positioned above or below a target element, and does not imply being necessarily positioned on the top on the basis of a gravity direction.

A mask assembly according to a first exemplary embodiment will now be described with reference to FIG. 1 to FIG. 3.

FIG. 1 shows an exploded perspective view of a mask assembly according to a first exemplary embodiment. FIG. 2 shows a top plan view of a mask assembly according to a first exemplary embodiment.

Figure 2:
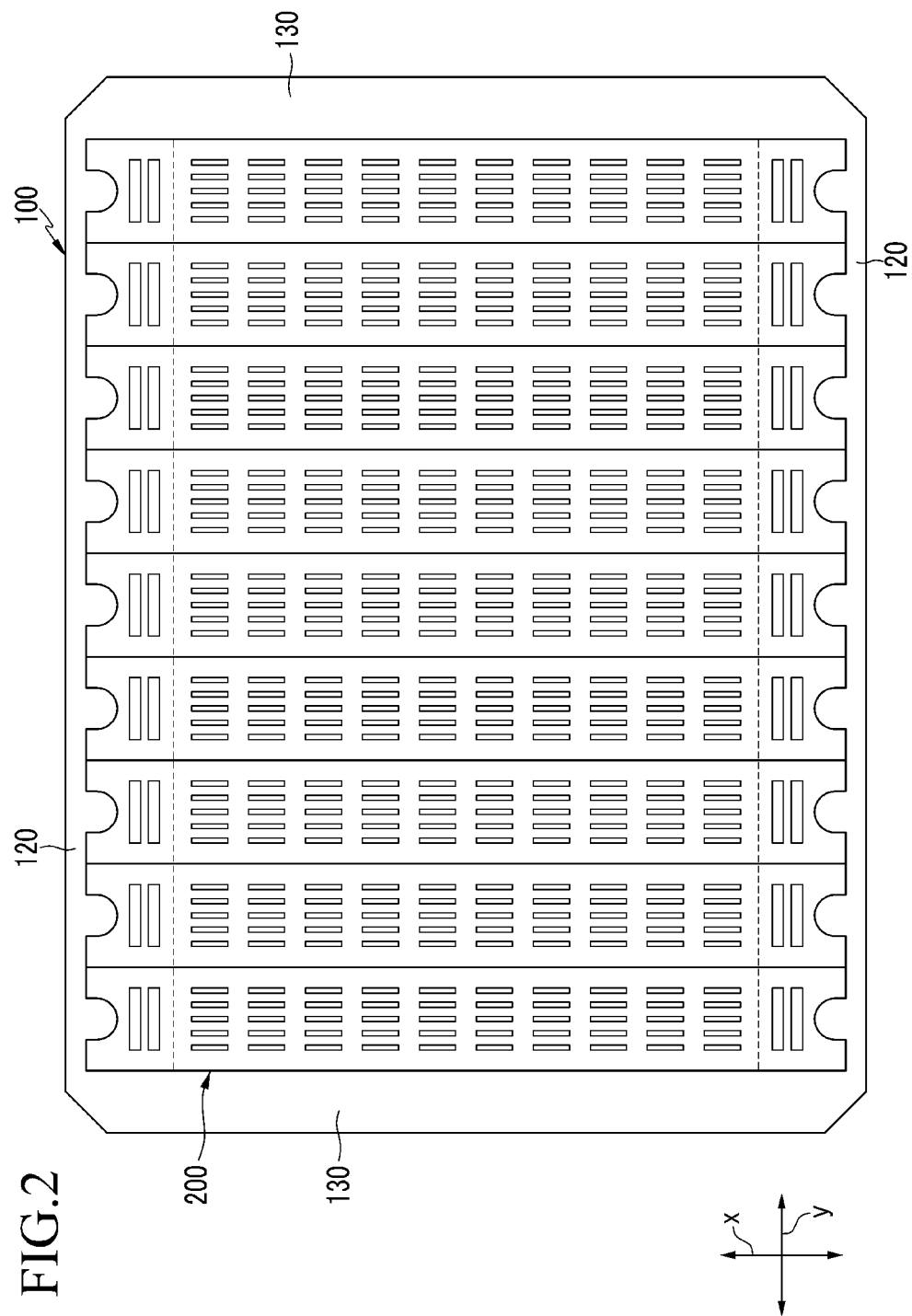
FIG. 2 shows a top plan view of a mask assembly according to a first exemplary embodiment.

As shown in FIG. 1 and FIG. 2, the mask assembly includes a frame 100 and a plurality of masks 200.

The frame 100 includes an opening 110 that fixes and supports both ends of each of the plurality of masks 200 and exposes the masks 200. The frame 100 further includes a pair of first supports 120 facing each other in a first direction (x) with an opening 110 disposed between the first supports 120, and a pair of second supports 130 facing each other in a second direction (y) crossing the first direction (x) with an opening 110 disposed between the second supports 130. The second direction (y) may be perpendicular to the first direction (x). Both ends 200a of the mask main body 210 of the mask 200 are supported at the first support 120. For example, both ends 200a of the mask main body 210 of the mask 200 are supported at the first support 120 of the frame 100 by using a fixing method such as welding while a tensile force is applied in the first direction (x).

In the frame 100 of the mask assembly according to the first exemplary embodiment, the first supporting part 120 forms a longer side of the frame 100 having a quadrangle shape and the second supporting part 130 forms a shorter side of the frame 100. However, in the frame of the mask assembly according to another exemplary embodiment, the first supporting part 120 and the second supporting part 130 may be formed to have substantially the same length.

Further, the frame of the mask assembly according another embodiment may be formed in a polygonal or circular shape.

The mask 200 fixed to the frame 100 is supported on the frame 100 while the tensile force is applied in the first direction (x), and the frame 100 receives a compressive force in the first direction (x), that is, an elongation direction of the mask 200, by the tensile force in the first direction (x) applied to the mask 200, so the frame 100 can be formed with a metal material such as stainless steel with great rigidity so that the frame 100 may not be deformed by the compressive force of the mask 200.

The mask 200 has a band shape extending in the first direction (x), and both ends 200a thereof are supported to the frame 100 in the state where the tensile force is applied in the first direction (x). Multiple masks 200 are formed, and they are disposed and supported at the frame 100 along the second direction (y) crossing the first direction (x).

Figure 3:
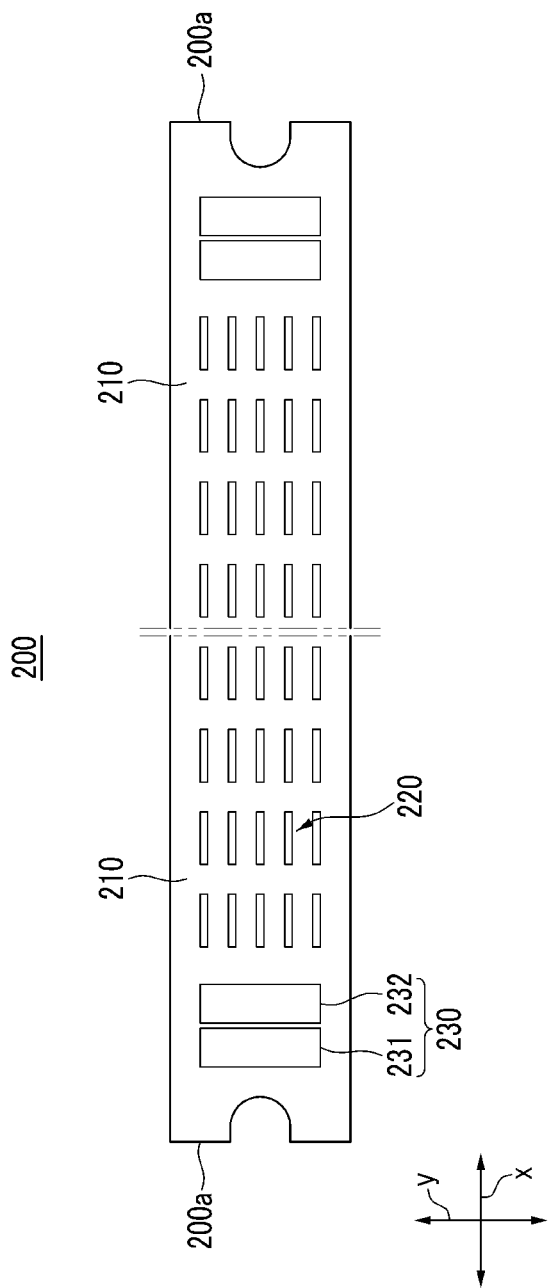
FIG. 3 shows a top plan view of a mask included in a mask assembly according to a first exemplary embodiment.

FIG. 3 shows a top plan view of a mask included in a mask assembly according to a first exemplary embodiment.

As shown in FIG. 3, the mask 200 includes a mask main body 210, pattern openings 220, and a dummy opening 230.

The mask main body 210 has a band form that is extended in the first direction (x), is provided in the opening 110 of the frame 100, and is supported on the frame 100. A plurality of pattern openings 220 that are disposed in the first direction (x) are formed on the mask main body 210.

The plurality of pattern openings 220 are disposed in one mask 200 in the first direction (x). The pattern openings 220 may correspond to one organic light emitting display. In this case, patterns forming several organic light emitting displays can be simultaneously formed on a mother substrate, on which the organic light emitting display will be manufactured, by a single process through the mask 200. That is, the pattern openings 220 are disposed on the mask 200 corresponding to a deposition area of patterns configuring an organic light emitting display. The pattern openings 220 have an open pattern that penetrates the mask 200 so that the patterns that configure the organic light emitting display may be formed on a mother substrate through the pattern openings 220. Each pattern opening 220 can have a stripe or dot form.

Each pattern opening 220 of the mask 200 included in the mask assembly according to the first exemplary embodiment has a stripe or dot form, and a mask included in a mask assembly according to another exemplary embodiment can have various forms.

The dummy opening 230 is provided neighboring the pattern openings 220 disposed in the outermost area from among the pattern openings 220 that are disposed in the first direction (x).

The dummy opening 230 is provided between the pattern openings 220 and the ends 200a of the mask main body 210 and has a different form from the pattern openings 220. The dummy opening 230 includes a first sub-dummy opening 231 and a second sub-dummy opening 232. That is, the dummy opening 230 includes a plurality of sub-dummy openings.

The first sub-dummy opening 231 is provided between the pattern openings 220 and the end 200a of the mask main body 210, and the second sub-dummy opening 232 is provided between the first sub-dummy opening 231 and the pattern openings 220. The first sub-dummy opening 231 and the second sub-dummy opening 232 each pass through the mask main body 210.

The first sub-dummy opening 231 and the second sub-dummy opening 232 may have the same shape. The first sub-dummy opening 231 and the second sub-dummy opening 232 respectively have a rectangular shape having a longer side in the second direction (y) crossing the first direction (x).

The first sub-dummy opening 231 has a rectangular shape having a longer side in the second direction (y), is disposed closer to the end 200a of the mask main body 210 than the second sub-dummy opening 232, and is provided between the pattern openings 220 and the end 200a of the mask main body 210 so when the tensile force is applied in the first direction (x) to the mask 200, the first sub-dummy opening 231 is deformed because of the tensile force, the tensile force applied to the pattern openings 220 is divided, and deformation of the pattern openings 220 due to the tensile force applied in the first direction (x) is controlled.

Further, the second sub-dummy opening 232 has a rectangular shape having a longer side in the second direction (y), is disposed closer to the pattern openings 220 than the first sub-dummy opening 231, and is provided between the first sub-dummy opening 231 and the pattern openings 220 so when the tensile force is applied in the first direction (x) to the mask 200, the second sub-dummy opening 232 is deformed by the tensile force, the tensile force applied to the pattern openings 220 is divided, and deformation of the pattern openings 220 because of the tensile force applied in the first direction (x) is controlled.

That is, when the tensile force is applied in the first direction (x) to the mask 200, the first sub-dummy opening 231 is deformed by the tensile force, the second sub-dummy opening 232 is deformed by the tensile force divided by the first sub-dummy opening 231, and the tensile force applied to the pattern openings 220 is divided, and therefore, deformation of the pattern openings 220 used for depositing the organic layer by the tensile force applied in the first direction (x) is substantially controlled.

As described above, the mask 200 of the mask assembly according to the first exemplary embodiment includes the dummy opening 230 including the first sub-dummy opening 231 and the second sub-dummy opening 232, and the tensile force applied to the mask 200 when the mask 200 is fixed to the frame 100 is consecutively divided by the first sub-dummy opening 231 and the second sub-dummy opening 232, so deformation of the pattern openings 220 by the tensile force is controlled. That is, the mask 200 for controlling deformation of the pattern openings 220 formed on the mask 200 by the tensile force applied to the mask 200, and the mask assembly including the same are provided.

A mask according to a second exemplary embodiment will now be described with reference to FIG. 4.

Parts that are different from the first exemplary embodiment will be described, and parts that are not described follow the first exemplary embodiment. For better comprehension and ease of description, the constituent elements of the second exemplary embodiment that are the same as the first exemplary embodiment will have the same reference numerals.

Figure 4:
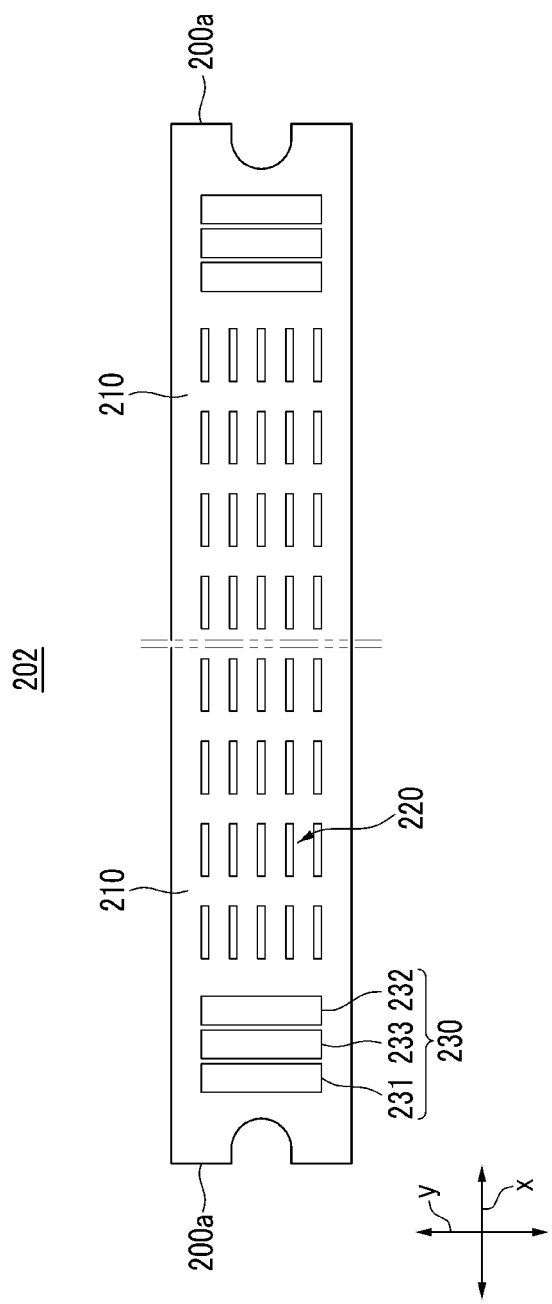
FIG. 4 shows a top plan view of a mask according to a second exemplary embodiment.

FIG. 4 shows a top plan view of a mask according to a second exemplary embodiment.

As shown in FIG. 4, the mask 202 includes a mask main body 210, pattern openings 220, and a dummy opening 230.

The dummy opening 230 is provided between the pattern openings 220 and the end 200a of the mask main body 210 and has a different form from the pattern openings 220. The dummy opening 230 includes a first sub-dummy opening 231, a second sub-dummy opening 232, and a third sub-dummy opening 233. That is, the dummy opening 230 includes a plurality of sub-dummy openings.

The first sub-dummy opening 231 is provided between the pattern openings 220 and the end 200a of the mask main body 210, the second sub-dummy opening 232 is provided between the first sub-dummy opening 231 and the pattern openings 220, and the third sub-dummy opening 233 is provided between the first sub-dummy opening 231 and the second sub-dummy opening 232. The first sub-dummy opening 231, the second sub-dummy opening 232, and the third sub-dummy opening 233 respectively pass through the mask main body 210.

The first sub-dummy opening 231, the second sub-dummy opening 232, and the third sub-dummy opening 233 respectively have the same rectangular shape having a longer side in the second direction (y) crossing the first direction (x).

The first sub-dummy opening 231 has a rectangular shape having a longer side in the second direction (y), neighbors the end 200a of the mask main body 210, and is provided between the pattern openings 220 and the end 200a of the mask main body 210. When the tensile force is applied in the first direction (x) to the mask 202, the first sub-dummy opening 231 is deformed by the tensile force so the tensile force applied to the pattern openings 220 is divided and deformation of the pattern openings 220 by the tensile force applied in the first direction (x) is controlled.

Also, the second sub-dummy opening 232 has a rectangular shape having a longer side in the second direction (y), neighbors the pattern openings 220, and is provided between the first sub-dummy opening 231 and the pattern openings 220. When the tensile force is applied in the first direction (x) to the mask 202, the second sub-dummy opening 232 is deformed because of the tensile force so the tensile force applied to the pattern openings 220 is divided and deformation of the pattern openings 220 by the tensile force applied in the first direction (x) is controlled.

Further, the third sub-dummy opening 233 has a rectangular shape having a longer side in the second direction (y) and is provided between the first sub-dummy opening 231 and the second sub-dummy opening 232. When the tensile force is applied in the first direction (x) to the mask 202, the third sub-dummy opening 233 is deformed by the tensile force so the tensile force applied to the pattern openings 220 is divided and deformation of the pattern openings 220 by the tensile force applied in the first direction (x) is controlled.

That is, when the tensile force is applied to the mask 202 in the first direction (x), the first sub-dummy opening 231 is deformed by the tensile force, the third sub-dummy opening 233 is deformed by the tensile force divided by the first sub-dummy opening 231, and the second sub-dummy opening 232 is deformed by the tensile force divided by the third sub-dummy opening 233 to thus divide the tensile force applied to the pattern openings 220, so deformation of the pattern openings 220 used for depositing the organic layer by the tensile force applied in the first direction (x) is substantially controlled.

As described above, the mask 202 according to the second exemplary embodiment includes the dummy opening 230 including the first sub-dummy opening 231, the second sub-dummy opening 232, and the third sub-dummy opening 233, so the tensile force applied to the mask 202 when the mask 202 is fixed to the frame 100 is continuously divided by the first sub-dummy opening 231, the third sub-dummy opening 233, and the second sub-dummy opening 232, and deformation of the pattern openings 220 by the tensile force is controlled. That is, the mask 202 for controlling deformation of the pattern openings 220 formed on the mask 202 by the tensile force applied to the mask 202 is provided.

A mask according to a third exemplary embodiment will now be described with reference to FIG. 5.

Parts that are different from the first exemplary embodiment will be described, and parts that are not described follow the first exemplary embodiment. For better comprehension and ease of description, the same constituent elements according to the third exemplary embodiment as the first exemplary embodiment will have the same reference numerals.

FIG. 5 shows a top plan view of a mask according to a third exemplary embodiment.

As shown in FIG. 5, the mask 203 includes a mask main body 210, pattern openings 220, and a dummy opening 230.

The dummy opening 230 is provided between the pattern openings 220 and the end 200a of the mask main body 210, and has a form that is different from the pattern openings 220. The dummy opening 230 includes a fourth sub-dummy opening 234 and a fifth sub-dummy opening 235. That is, the dummy opening 230 includes a plurality of sub-dummy openings.

The fourth sub-dummy opening 234 and the fifth sub-dummy opening 235 are disposed to neighbor each other between both edges 200b of the mask main body 210 in the second direction (y) crossing the first direction (x). The fourth sub-dummy opening 234 and the fifth sub-dummy opening 235 respectively pass through the mask main body 210. Specifically, the fourth and fifth sub-dummy openings are arranged in a second direction, and therefore, the fourth sub-dummy opening is disposed closer to one of the edges than the fifth sub-dummy opening, and the fifth sub-dummy opening is disposed closer to another of the edges than the fourth sub-dummy opening. Herein, the edges are the side of the mask main body 210 that connect one end 200a to the other end 200a.

The fourth sub-dummy opening 234 and the fifth sub-dummy opening 235 respectively have the same rectangular shape having a longer side in the first direction (x).

The fourth sub-dummy opening 234 and the fifth sub-dummy opening 235 have a rectangular shape having a longer side in the first direction (x), they are disposed between both the edges 200b of the mask main body 210, they neighbor the end 200a of the mask main body 210, and they are provided between the pattern openings 220 and the end 200a of the mask main body 210. When the tensile force is applied in the first direction (x) to the mask 203, the fourth sub-dummy opening 234 and the fifth sub-dummy opening 235 are deformed by the tensile force, and the tensile force applied to the pattern openings 220 is divided, so deformation of the pattern openings 220 by the tensile force applied in the first direction (x) is controlled.

That is, when the tensile force is applied in the first direction (x) to the mask 203, the fourth sub-dummy opening 234 and the fifth sub-dummy opening 235 are deformed by the tensile force, and the tensile force applied to the pattern openings 220 is divided, so deformation of the pattern openings 220 used for depositing the organic layer by the tensile force applied in the first direction (x) is substantially controlled.

As described above, the mask 203 according to the third exemplary embodiment includes the dummy opening 230 including the fourth sub-dummy opening 234 and the fifth sub-dummy opening 235 so the tensile force applied to the mask 203 is divided by the dummy opening 230 and deformation of the pattern openings 220 by the tensile force is controlled. That is, the mask 203 for controlling deformation of the pattern openings 220 formed on the mask 203 by the tensile force applied to the mask 203 is provided.

A mask according to a fourth exemplary embodiment will now be described with reference to FIG. 6.

Parts that are different from the first exemplary embodiment will be described, and parts that are not described follow the first exemplary embodiment. For better comprehension and ease of description, the same constituent elements according to the fourth exemplary embodiment as the third exemplary embodiment will have the same reference numerals.

FIG. 6 shows a top plan view of a mask according to a fourth exemplary embodiment.

As shown in FIG. 6, the mask 204 includes a mask main body 210, pattern openings 220, and a dummy opening 230.

The dummy opening 230 is provided between the pattern openings 220 and the end 200a of the mask main body 210, and has a form that is different from the pattern openings 220. The dummy opening 230 includes a fourth sub-dummy opening 234, a fifth sub-dummy opening 235, and a sixth sub-dummy opening 236. That is, the dummy opening 230 includes a plurality of sub-dummy openings.

The fourth sub-dummy opening 234 and the fifth sub-dummy opening 235 are disposed to neighbor each other between both edges 200b of the mask main body 210 in the second direction (y) crossing the first direction (x). The fourth sub-dummy opening 234 and the fifth sub-dummy opening 235 respectively pass through the mask main body 210.

The fourth sub-dummy opening 234 and the fifth sub-dummy opening 235 respectively have the same rectangular shape having a longer side in the first direction (x).

The sixth sub-dummy opening 236 is provided between the pattern openings 220 and a set of the fourth sub-dummy opening 234 and the fifth sub-dummy opening 235. The sixth sub-dummy opening 236 has a rectangular shape having a longer side in the second direction (y) crossing the first direction (x). The sixth sub-dummy opening 236 is passed through the mask main body 210.

The fourth sub-dummy opening 234 and the fifth sub-dummy opening 235 have a rectangular shape having a longer side in the first direction (x), they are disposed between both edges 200b of the mask main body 210, they neighbor the end 200a of the mask main body 210, and they are provided between the pattern openings 220 and the end 200a of the mask main body 210. When the tensile force is applied in the first direction (x) to the mask 204, they are deformed by the tensile force so the tensile force applied to the pattern openings 220 is divided, and deformation of the pattern openings 220 by the tensile force applied in the first direction (x) is controlled.

Also, the sixth sub-dummy opening 236 has a rectangular shape having a longer side in the second direction (y), it neighbors the pattern openings 220, it is provided between the pattern openings 220 and a set of the fourth sub-dummy opening 234 and the fifth sub-dummy opening 235. When the tensile force is applied in the first direction (x) to the mask 204, it is deformed by the tensile force, so the tensile force applied to the pattern openings 220 is divided and deformation of the pattern openings 220 by the tensile force applied in the first direction (x) is controlled.

That is, when the tensile force is applied to the mask 204 in the first direction (x), the fourth sub-dummy opening 234 and the fifth sub-dummy opening 235 are deformed by the tensile force, the sixth sub-dummy opening 236 is deformed by the tensile force divided by the fourth sub-dummy opening 234 and the fifth sub-dummy opening 235, and the tensile force applied to the pattern openings 220 is divided so deformation of the pattern openings 220 used for depositing the organic layer by the tensile force applied in the first direction (x) is substantially controlled.

As described above, the mask 204 according to the fourth exemplary embodiment includes the dummy opening 230 including the fourth sub-dummy opening 234, the fifth sub-dummy opening 235, and the sixth sub-dummy opening 236, and the tensile force applied to the mask 204 is divided by the dummy opening 230 so deformation of the pattern openings 220 by the tensile force is controlled. That is, the mask 204 for controlling deformation of the pattern openings 220 formed on the mask 204 by the tensile force applied to the mask 204 is provided.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask supported by a frame, comprising:
a mask main body in a band shape extending in a first direction, the mask main body having edges extending parallel to the first direction, the mask main body having ends extending perpendicular to the first direction, the ends of the mask main body being supported by the frame;
a plurality of pattern openings formed in the mask main body; and
a dummy opening provided between the pattern openings and one of the ends of the mask main body, the dummy opening including a first sub-dummy opening and a second sub-dummy opening, the second sub-dummy opening disposed between one of the edges of the mask main body and the first sub-dummy opening, wherein each of the first sub-dummy opening and the second sub-dummy opening has a rectangular shape having a longer side extending in the first direction.

2. The mask of claim 1, wherein the first sub-dummy opening and the second sub-dummy opening respectively have the same shape, and neighbor each other.

3. The mask of claim 1, wherein the dummy opening further includes a third sub-dummy opening provided between the pattern openings and a set of the first sub-dummy opening and the second sub-dummy opening.

4. The mask of claim 3, wherein each of the first sub-dummy opening and the second sub-dummy opening has a rectangular shape having a longer side extending in the first direction, the third sub-dummy opening having a rectangular shape having a longer side extending in a second direction that is perpendicular to the first direction.

5. The mask of claim 1, wherein the pattern openings have a stripe or dot form.

6. A mask assembly comprising:
a frame including an opening; and
at least one mask disposed on the opening of the frame, the at least one mask comprising:
a mask main body in a band shape extending in a first direction, the mask main body having edges extending parallel to the first direction, the mask main body having ends extending perpendicular to the first direction, the ends of the mask main body being supported by the frame;
a plurality of pattern openings formed in the mask main body; and
a dummy opening provided between the pattern openings and one of the ends of the mask main body, the dummy opening including a first sub-dummy opening and a second sub-dummy opening, the second sub-dummy opening disposed between one of the edges of the mask main body and the first sub-dummy opening, wherein each of the first sub-dummy opening and the second sub-dummy opening has a rectangular shape having a longer side extending in the first direction.

7. The mask assembly of claim 6, wherein the dummy opening further includes a third sub-dummy opening provided between the pattern openings and a set of the first sub-dummy opening and the second sub-dummy opening.

8. The mask assembly of claim 6, wherein each of the first sub-dummy opening and the second sub-dummy opening has a rectangular shape having a longer side extending in the first direction, the third sub-dummy opening having a rectangular shape having a longer side extending in a second direction that is perpendicular to the first direction.

* * * * *